(12) United States Patent
Lin

(10) Patent No.: US 10,361,171 B2
(45) Date of Patent: Jul. 23, 2019

(54) STACKED PACKAGE STRUCTURE AND MANUFACTURING METHOD THEREOF

(71) Applicant: NANYA TECHNOLOGY CORPORATION, New Taipei (TW)

(72) Inventor: Po-Chun Lin, Changhua County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/859,703

(22) Filed: Jan. 1, 2018

(65) Prior Publication Data

US 2018/0145049 A1    May 24, 2018

Related U.S. Application Data

(62) Division of application No. 15/345,490, filed on Nov. 7, 2016, now Pat. No. 9,893,035.

(51) Int. Cl.

| | |
|---|---|
| *H01L 25/065* | (2006.01) |
| *H01L 21/683* | (2006.01) |
| *H01L 23/31* | (2006.01) |
| *H01L 25/00* | (2006.01) |

(52) U.S. Cl.
CPC ...... *H01L 25/0652* (2013.01); *H01L 21/6835* (2013.01); *H01L 23/3128* (2013.01); *H01L 25/0657* (2013.01); *H01L 25/50* (2013.01); *H01L 2224/18* (2013.01); *H01L 2225/0652* (2013.01); *H01L 2225/06517* (2013.01); *H01L 2225/06548* (2013.01)

(58) Field of Classification Search
None
See application file for complete search history.

(56) References Cited

U.S. PATENT DOCUMENTS

| | | |
|---|---|---|
| 2013/0307140 A1 | 11/2013 | Huang et al. |
| 2014/0252646 A1* | 9/2014 | Hung .............. H01L 23/481 257/774 |
| 2016/0079205 A1 | 3/2016 | Lin et al. |
| 2016/0126220 A1 | 5/2016 | Chen et al. |

* cited by examiner

*Primary Examiner* — Long Pham

(74) *Attorney, Agent, or Firm* — CKC & Partners Co., LLC

(57) ABSTRACT

A stacked package structure includes a first package structure having a first surface and a second surface opposite to the first surface. The first package structure includes a least one first die having a first active region disposed at a bottom of the first die; a first redistribution layer disposed on the top surface of the first die; and a plurality of first bumps disposed on the bottom surface of the first active region.

7 Claims, 17 Drawing Sheets

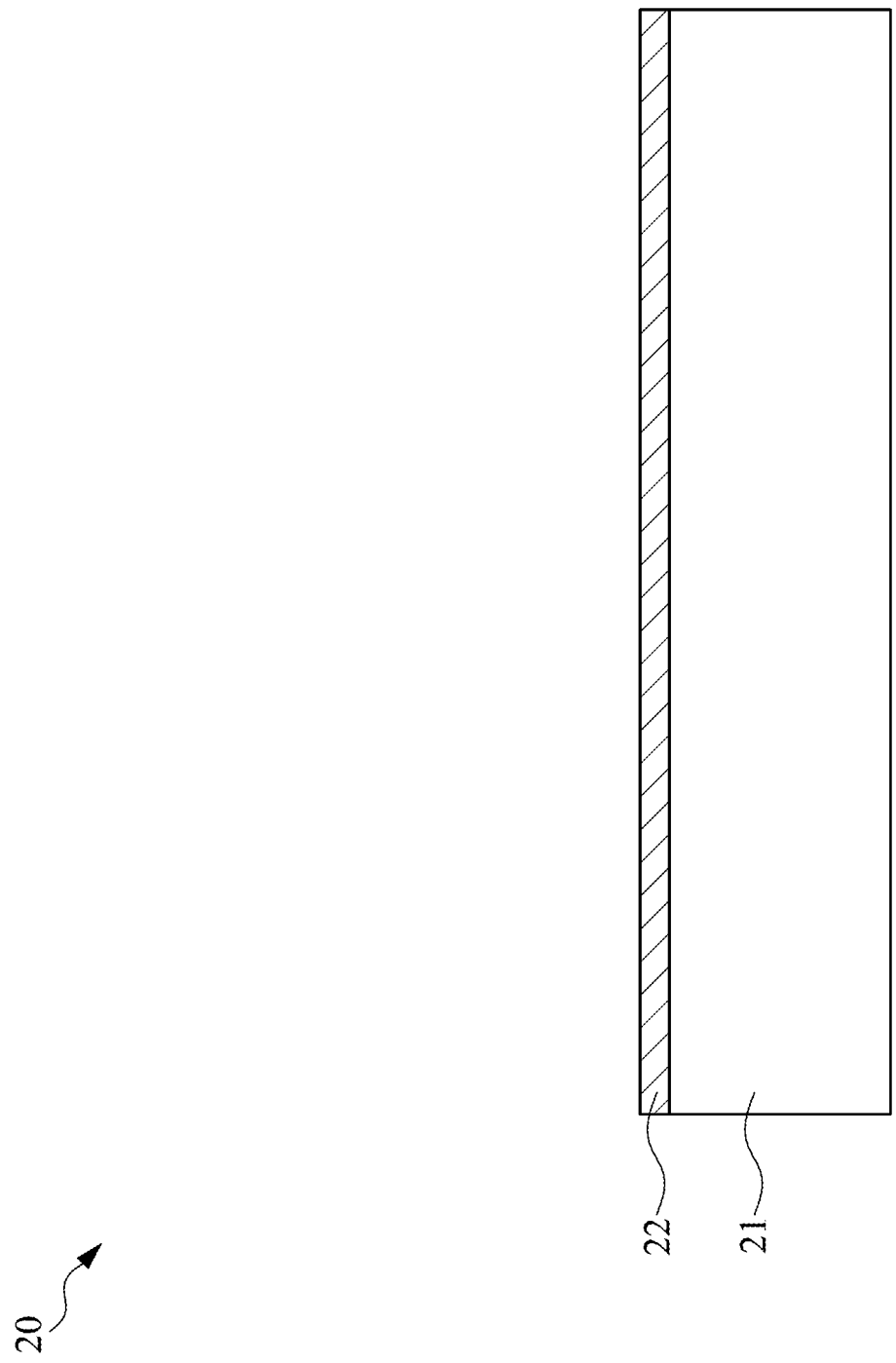

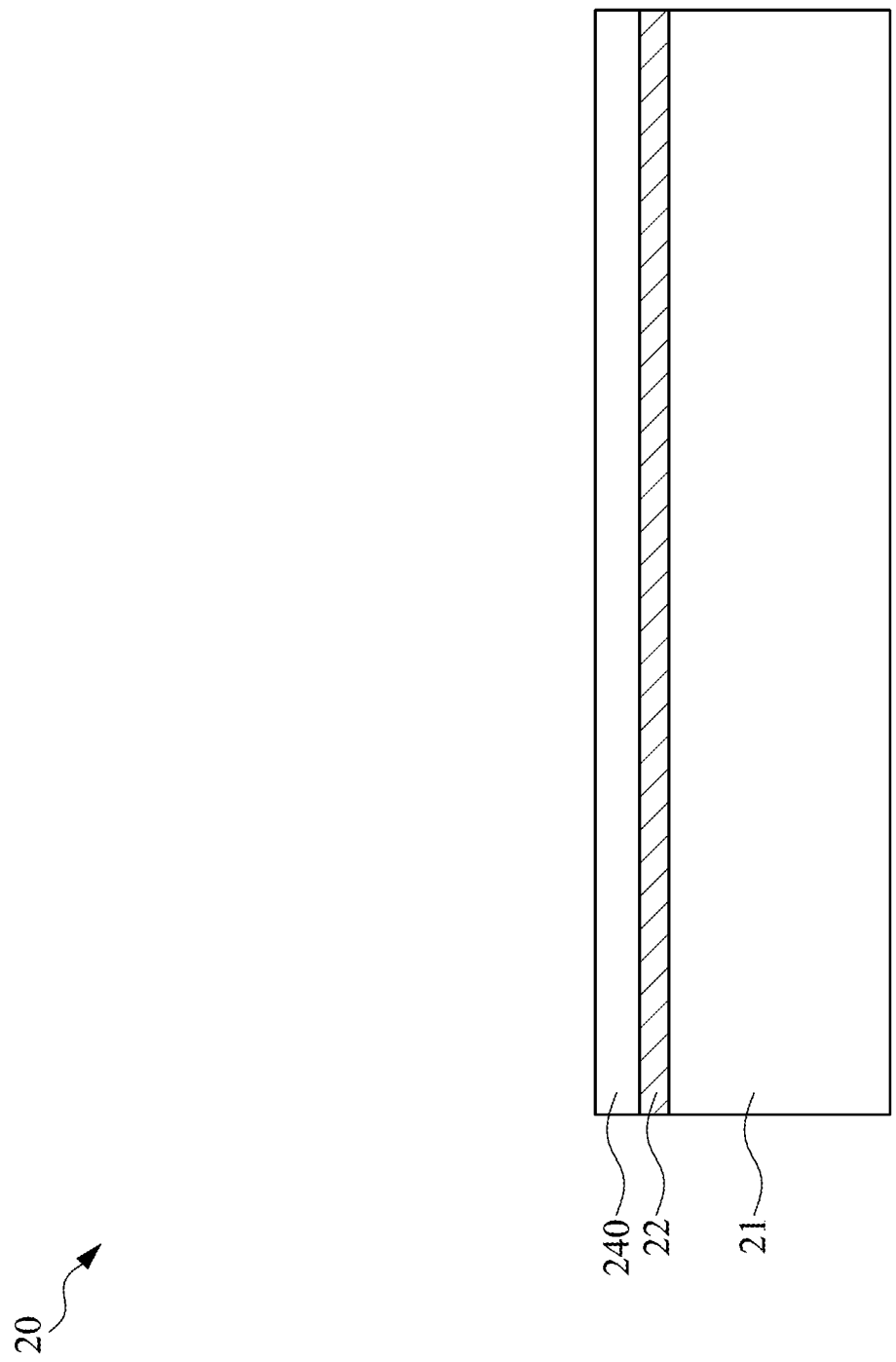

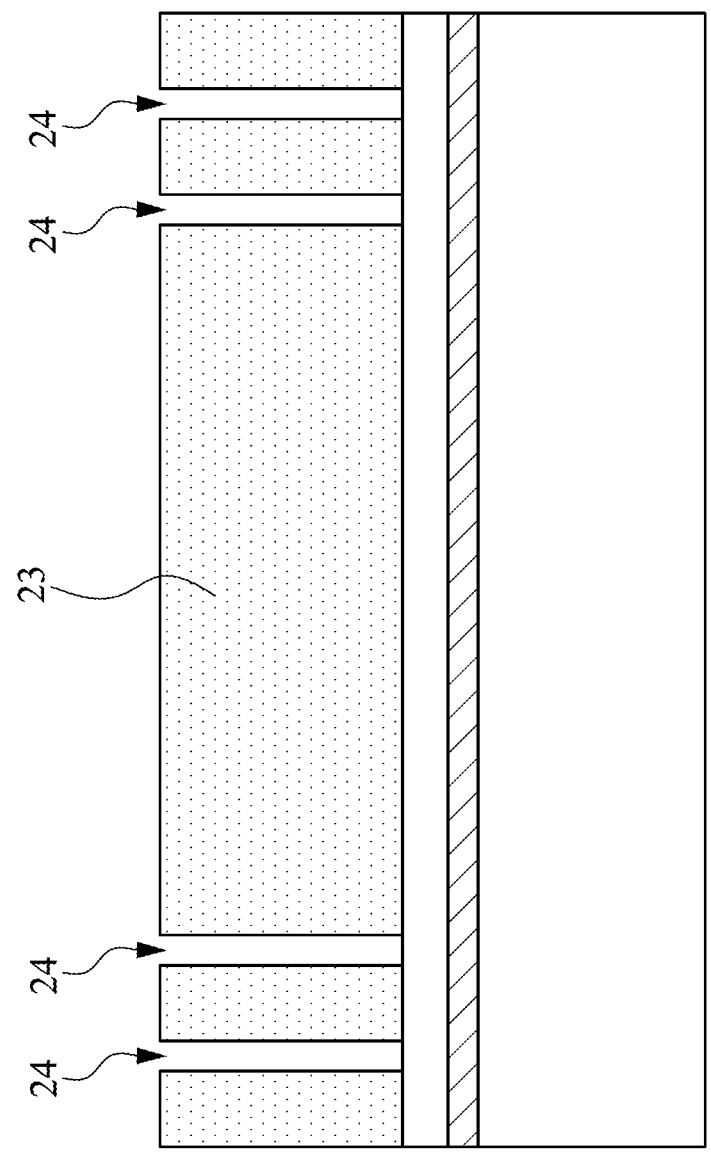

STACKED PACKAGE STRUCTURE AND MANUFACTURING METHOD THEREOF

CROSS-REFERENCE TO RELATED APPLICATION

The present application is a Divisional application of the U.S. application Ser. No. 15/345,490, filed Nov. 7, 2016, which is herein incorporated by reference.

BACKGROUND

Field of Invention

The present invention relates to a stacked package structure.

Description of Related Art

Through the development of package structures, the tendency for the package to warp due to inherent stresses increases. Specifically, package warpage has been observed during the elevated temperature processes due to the different thermal expansion coefficient properties between the flip-chip package substrate material, copper conductor layers, the chip itself, and other substrate assembly materials. Package warpage has been a critical issue that strongly influences the performance of the package device. Thus, to meet requirements for a higher speed and more reliability, advanced package forming methods and structures have been developed.

SUMMARY

An embodiment of the present disclosure is a stacked package structure, comprising a first package structure having a first surface and a second surface opposite to the first surface, the first package structure comprising: a least one first die having a first active region disposed at a bottom of the first die; a first redistribution layer disposed on the first die, wherein a top surface of the first redistribution layer serves as the first surface of the first package structure; and a plurality of first bumps disposed under the first active region, wherein a part of the first bumps are electrically connected to the first active region.

Another embodiment of the present disclosure is a method for manufacturing a stacked package structure, comprising forming a first package structure having a first surface and a second surface, comprising forming a first release film on a first carrier substrate; forming a first redistribution layer on the first release film, wherein a bottom surface of the first redistribution layer serves as the first surface; attaching at least one first die on the first redistribution layer, wherein the first die has a first active region disposed on a side away from the first redistribution layer of the first die; forming a plurality of first bumps on the first die, the first conductive features, and the first molding material, wherein a part of the first bumps are electrically connected to the first active region; and removing the first carrier substrate and the first release film.

BRIEF DESCRIPTION OF THE DRAWINGS

The invention can be more fully understood by reading the following detailed description of the embodiment, with reference made to the accompanying drawings as follows:

FIGS. 4A to 4J are schematic cross-sectional views of various stages of a method of manufacturing a stacked package structure according to an embodiment of the present disclosure.

DETAILED DESCRIPTION

Figure 1:
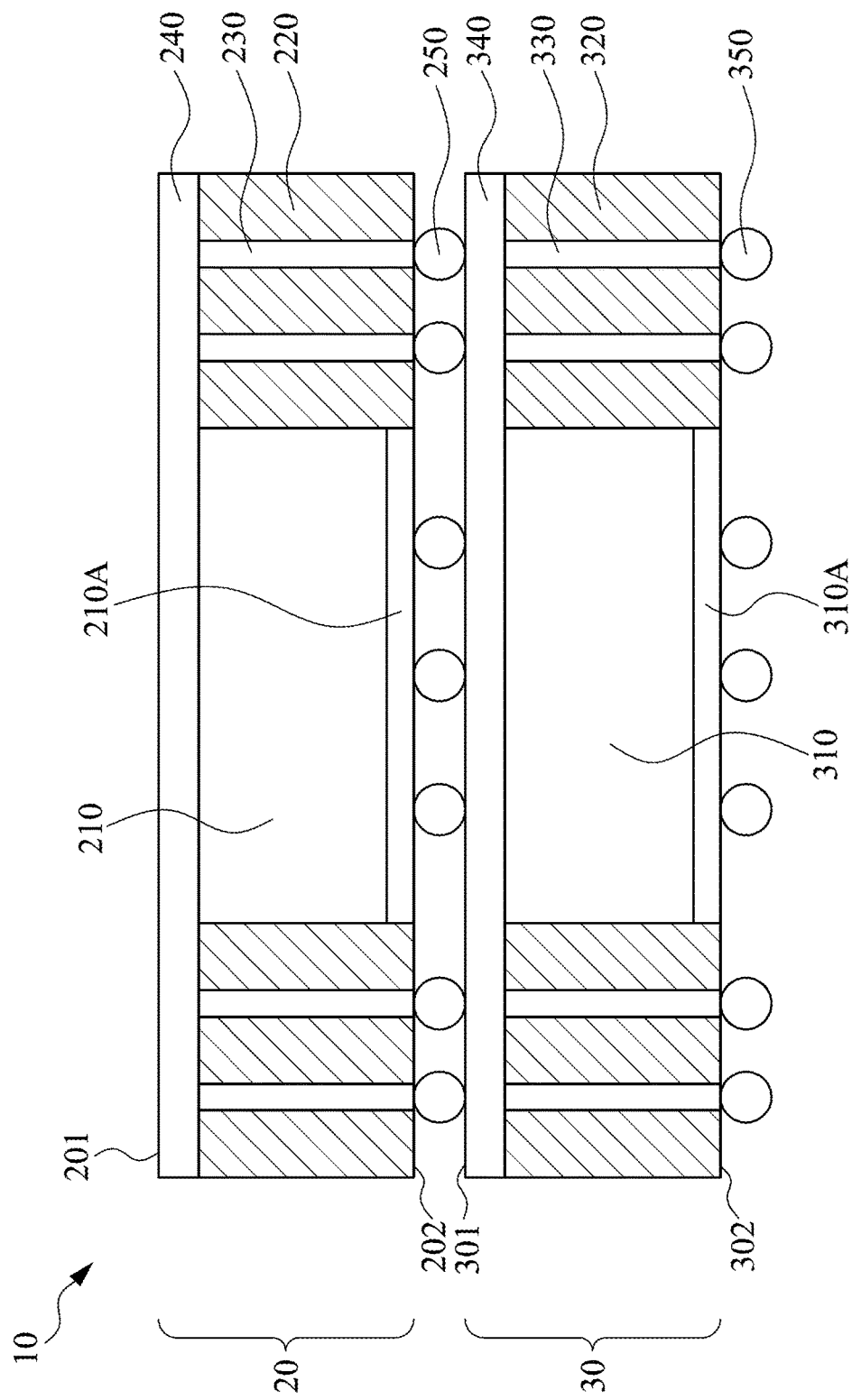
FIG. 1 is a schematic cross-sectional view of a stacked package structure according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional view of a stacked package structure 10 according to an embodiment of this disclosure. A stacked package structure 10 is provided. In some embodiments, the stacked package structure 10 is manufactured in wafer level processes.

As shown in FIG. 1, the stacked package structure 10 includes a first package structure 20 and a second package structure 30. The first package structure 20 has a first surface 201 and a second surface 202 opposite to the first surface 201. The first package structure 20 includes a first die 210, in which the first die 210 has a first active region 210A disposed at the bottom of the first die 210. Moreover, the first active region 210A of the first die 210 has a higher circuit density (e.g. metal lines) than that of the other regions of the first die 210. That is, the first active region 210A includes a higher metal distribution than that of the other regions of the first die 210.

The first package structure 20 further includes a plurality of first conductive features 230. In the present embodiment, the first conductive features 230 are conductive vias. The first conductive features 230 may be metal, such as aluminum (Al), tungsten (W), copper (Cu), Cobalt (Co), or other suitable metals.

The first package structure 20 further includes a first molding material 220 filled in the spaces between the first die 210, and the first conductive features 230. In some embodiments, the first molding material 220 may be epoxy resin, but not limited thereto. The person having ordinary skill in the art can make proper modifications to the material of the first molding material 220 depending on actual applications.

The top surface of the first die 210, the top surface of the first molding material 220, and the top surface of the first conductive features 230 are substantially coplanar. On the other hand, the bottom surface of the first active region 210A of the first die 210, the bottom surface of the first molding material 220, and the bottom surface of the first conductive features 230 are substantially coplanar, and serve as the second surface 202 of the first package structure 20. Accordingly, the first die 210, the first molding material 220, and the first conductive features 230 have substantially the same height.

The first package structure 20 further includes a first redistribution layer 240 disposed on the first die 210, the first molding material 220, and the first conductive features 230. The top surface of the first redistribution layer 240 serves as the first surface 201 of the first package structure 20. In some embodiments, the first redistribution layer 240 may include interconnection structures, such as metal lines and conductive vias, and dielectric material encapsulating the interconnection structures. The first conductive features 230 are electrically connected to the first redistribution layer 240. Moreover, the first redistribution layer 240 may be electrically connected to other electronic devices.

As described above, in some embodiments, the first active region 210A having the higher distribution of metal serves as a part of the second surface 202. Also, the first redistribution layer 240 having interconnection structures, such as metal lines and conductive vias, serves as the first surface 201. According, the opposite sides (e.g. first surface 201 and second surface 202) of the first package structure 20 have higher metal density. Since the manufacturing process is generally performed at a high temperature (e.g. about 250° C.), such configuration may release the warpage during processing, due to the balance effect by the metals disposed at the opposite sides of the package structure.

The first package structure 20 further includes a plurality of first bumps 250 disposed on the second surface 202 of the first package structure 20. In the other words, the first bumps are disposed under the first die 210, the first molding material 220, and the first conductive features 230. The first bumps 250 directly contact with the first active region 210A of the first die 210 and the first conductive features 230. That is, the first bumps 250 are electrically connected to the first active region 210A of the first die 210 and the first conductive features 230. Accordingly, a portion of the first bumps 250 are electrically connected to the first redistribution layer 240 through the first conductive features 230.

The second package structure 30 is similar to the first package structure 20 in configuration and some details are not repeated here to avoid duplicity. Similarly, the second package structure 30 includes a second die 310 having a second active region 310A, a second molding material 320, a plurality of second conductive features 330, a second redistribution layer 340, and a plurality of second bumps 350.

The second active region 310A of the second die 310 has a higher circuit density (e.g. metal lines) than that of the other regions of the second die 310. That is, the second active region 310A includes a higher metal distribution than that of the other regions of the second die 310. Also, the second redistribution layer 340 has interconnection structures, such as metal lines and conductive vias. According, the opposite sides (e.g. third surface 301 and fourth surface 302) of the second package structure 30 have higher metal density. Since the manufacturing process is generally performed at a high temperature (e.g. about 250° C.), such temperature may create warpage during processing. In the present disclosure, due to the balance effect by the metals disposed at the opposite site of the package structure, the problem of warpage may be released.

The first package structure 20 is stacked on the second package structure 30 to form the stacked package structure 10, with the second surface 202 of the first package structure 20 facing the third surface 301 of the second package structure 30. The first bumps 250 are electrically connected to the second redistribution layer 340.

Figure 2:
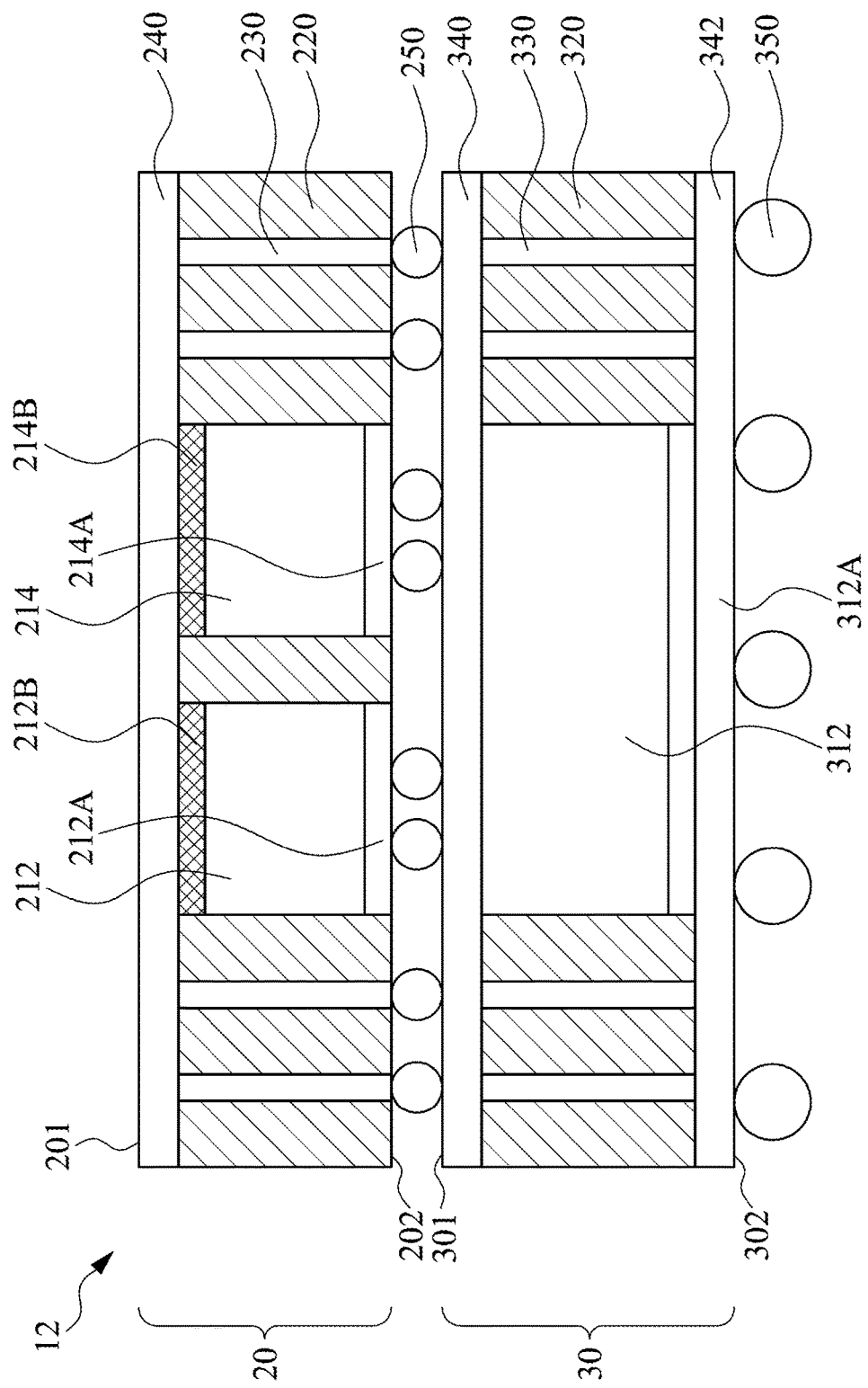
FIG. 2 is a schematic cross-sectional view of a stacked package structure according to an embodiment of the present disclosure.

FIG. 2 is a schematic cross-sectional view of a stacked package structure 12 according to an embodiment of the present disclosure. A stacked package structure 12 is provided. In some embodiments, the stacked package structure 12 is manufactured in wafer level processes.

As shown in FIG. 2, the stacked package structure 12 includes a first package structure 20 and a second package structure 30. The first package structure 20 has a first surface 201 and a second surface 202 opposite to the first surface 201.

The first package structure 20 includes a third die 212 and a fourth die 214. The third die 212 and fourth die 214 include a third active region 212A and a fourth active region 214A, respectively. The third die 212 and fourth die 214 may be the same in some embodiments and may be different in some other embodiments. Moreover, the third active region 212A and the fourth active region 214A have higher circuit density than that of the other regions of the third die 212 and fourth die 214, respectively. That is, the third active region 212A and the fourth active region 214A include a higher metal distribution (e.g. metal lines) than that of the other regions of the third die 212 and fourth die 214.

Additionally, a first interposed layer 212B and a second interposed layer 214B are disposed on the top of the third die 212 and the fourth die 214, respectively. In some embodiments, the first interposed layer 212B and the second interposed layer 214B may be dissipating material, such as a heat sink.

The first package structure 20 further includes a plurality of first conductive features 230. In the present embodiment, the first conductive features 230 are conductive vias.

The first package structure 20 further includes a first molding material 220 filled in the spaces between the third die 212, the fourth die 214, and the first conductive features 230.

The top surface of the first interposed layer 212B, the top surface of the second interposed layer 214B, the top surface of the first molding material 220, and the top surface of the first conductive features 230 are substantially coplanar. On the other hand, the bottom surface of the third active region 212A of the third die 212, the bottom surface of the fourth active region 214A of the fourth die 214, the bottom surface of the first molding material 220, and the bottom surface of the first conductive features 230 are substantially coplanar, and serve as the second surface 202 of the first package structure 20.

The first package structure 20 further includes a first redistribution layer 240 disposed on the third die 212, the fourth die 214, the first molding material 220, and the first conductive features 230. The top surface of the first redistribution layer 240 serves as the first surface 201 of the first package structure 20. In some embodiments, the first redistribution layer 240 may include interconnection structures, such as metal lines and conductive vias, and dielectric material encapsulating the interconnection structures. The first conductive features 230 are electrically connected to the first redistribution layer 240.

As described above, in some embodiments, the third active region 212A and fourth active region 214A having the higher distribution of metal serves as a part of the second surface 202. Also, the first redistribution layer 240 having interconnection structures, such as metal lines and conductive vias, serves as the first surface 201. According, the opposite sides (e.g. first surface 201 and second surface 202) of the first package structure 20 have higher metal density. Since the manufacturing process are generally performed at a high temperature (e.g. about 250° C.), such configuration may release the warpage during processing, due to the balance effect by the metals disposed at the opposite site of the package structure.

The first package structure 20 further includes a plurality of first bumps 250 disposed on the second surface 202 of the first package structure 20. On the other words, the first bumps are disposed under the third die 212, the fourth die 214, the first molding material 220, and the first conductive features 230. The first bumps 250 directly contact with the third active region 212A, the fourth active region 214A, and the first conductive features 230. That is, the first bumps 250 are electrically connected to the third active region 212A, the fourth active region 214A, and the first conductive features 230. Accordingly, a portion of the first bumps 550 are electrically connected to the first redistribution layer 240 through the first conductive features 230.

The stacked package structure 12 further includes a second package structure 30 having a third surface 301 and a fourth surface 302. The configuration of the second package structure 30 is similar to the first package structure 20 and some details are not repeated here to avoid duplicity.

The second package structure 30 includes a fifth die 312 having a fifth active region 312A, a plurality of second conductive features 330, a second molding material 320 filled the spaces between the fifth die 312 and the second conductive features 330, a second redistribution layer 340, and a plurality of second bumps 350. The second redistribution 340 is disposed on the fifth die 312, the second molding material 320, and the second conductive features 330. The second redistribution 340 serves as the third surface 301 of the second package structure 30.

Additionally, the second package structure 30 further includes a third redistribution 342 disposed between the fifth die 312, the second molding material 320, the second conductive features 330 and the second bumps 350. The third redistribution 342 serves as the fourth surface 302 of the second package structure 30. The third redistribution 342 is electrically connected to the fifth active region 312, the second conductive features 330 and the second bumps 350.

The first package structure 20 is stacked on the second package structure 30 to form the stacked package structure 12, with the second surface 202 of the first package structure 20 facing the third surface 301 of the second package structure 30. The first bumps 250 are electrically connected to the second redistribution layer 340.

Figure 3:
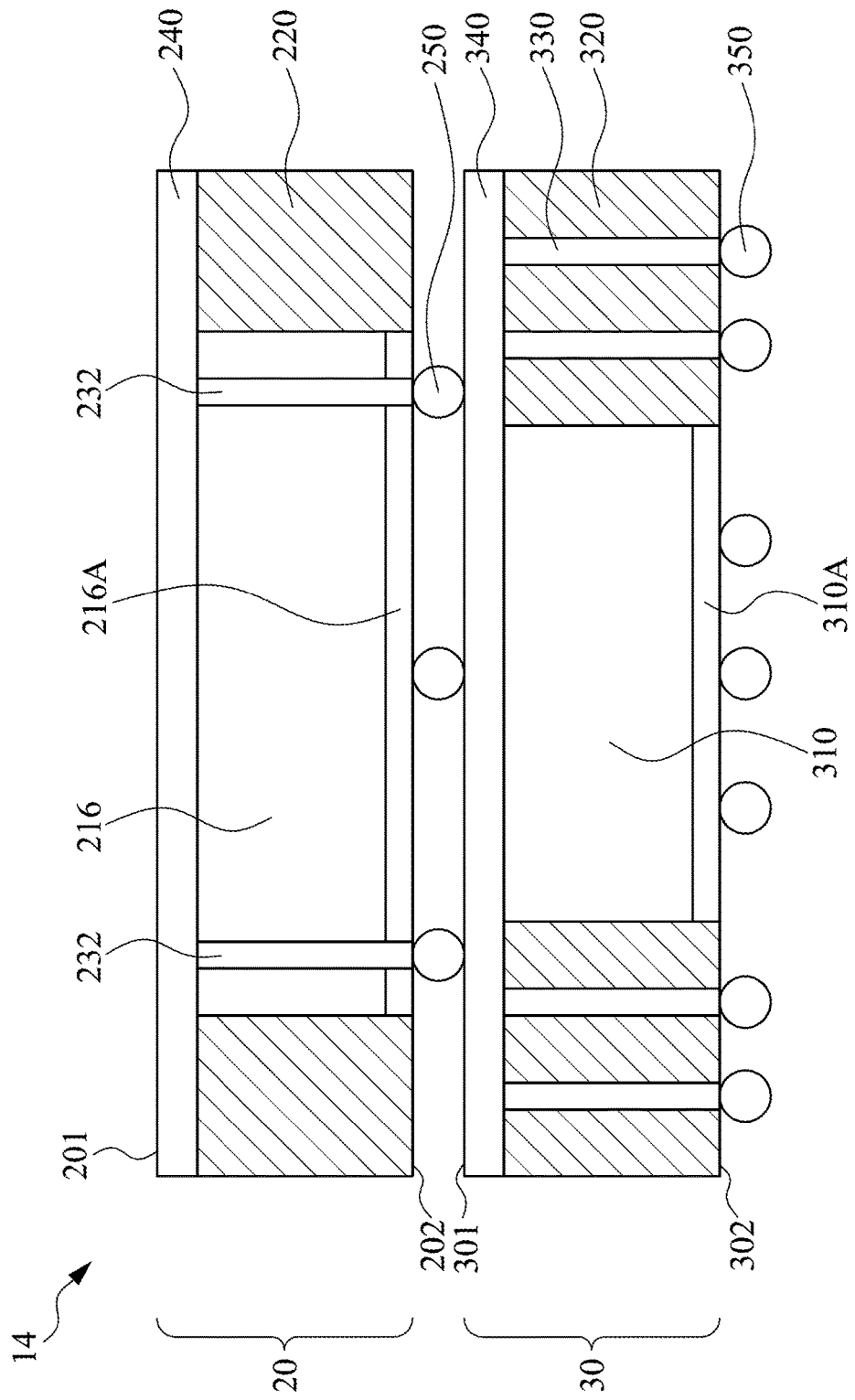
FIG. 3 is a schematic cross-sectional view of a stacked package structure according to an embodiment of the present disclosure.

FIG. 3 is a schematic cross-sectional view of a stacked package structure according to an embodiment of the present disclosure. A stacked package structure 14 is provided. The stacked package structure 14 includes a first package structure 20 and a second package structure 30. The second package structure 30 is described in FIG. 1. Thus, some details may be omitted for simplicity.

In this embodiment, the first package structure 20 has a first surface 201 and a second surface 202 opposite to the first surface 201. The first package structure 20 includes a sixth die 216 having a sixth active region 216A. Moreover, the sixth active region 216A has higher circuit density than that of the other regions of the sixth die 216. That is, the sixth active region 216A include a higher metal distribution (e.g. metal lines) than that of the other regions of the sixth die 216.

The first package structure 20 further includes a plurality of first conductive features 232. In the present embodiment, the first conductive features 232 are formed in the sixth die 216, and the first conductive features 230 may be referred to through silicon vias (TSV). The first conductive features 232 penetrate through the sixth die 216 and the sixth active region 216A, and may be directly connected to other devices (e.g. the bumps 250 described later). In some other embodiments, the first conductive features 232 penetrate through the sixth die 216 but do not penetrate through the sixth active region 216A. That is, the sixth active region 216A connects the first conductive features 232 to other devices, such as bumps.

The first package structure 20 further includes a first molding material 220 surrounding the sixth die 216. The top surface of the first molding material 220, the top surface of the first conductive features 232, and the top surface of the sixth die 216 are substantially coplanar. On the other hand, the bottom surface of the sixth active region 216A of the sixth die 216, the bottom surface of the first molding material 220, and the bottom surface of the first conductive features 232 are substantially coplanar, and serve as the second surface 202 of the first package structure 20. In some other embodiments, the first molding material 220 may be omitted.

The first package structure 20 further includes a first redistribution layer 240 disposed on the sixth die 216, the first molding material 220, and the first conductive features 232. The top surface of the first redistribution layer 240 serves as the first surface 201 of the first package structure 20. In some embodiments, the first redistribution layer 240 may include interconnection structures, such as metal lines and conductive vias, and dielectric material encapsulating the interconnection structures. The first conductive features 232 are electrically connected to the first redistribution layer 240.

As described above, in some embodiments, the sixth active region 216A having the higher distribution of metal serves as a part of the second surface 202. Also, the first redistribution layer 240 having interconnection structures, such as metal lines and conductive vias, serves as the first surface 201. According, the opposite sides (e.g. first surface 201 and second surface 202) of the first package structure 20 have higher metal density. Since the manufacturing process are generally performed at a high temperature (e.g. about 250° C.), such configuration may release the warpage during processing, due to the balance effect by the metals disposed at the opposite site of the package structure.

The first package structure 20 further includes a plurality of first bumps 250 disposed on the second surface 202 of the first package structure 20. On the other words, the first bumps are disposed under the sixth die 216, the first molding material 220, and the first conductive features 232. The first bumps 250 directly contact with the sixth region 216A, and the first conductive features 232. That is, the first bumps 250 are electrically connected to the sixth active region 216A and the first conductive features 232. Accordingly, a portion of the first bumps 550 are electrically connected to the first redistribution layer 240 through the first conductive features 232.

The first package structure 20 is stacked on the second package structure 30 to form the stacked package structure 12, with the second surface 202 of the first package structure 20 facing the third surface 301 of the second package structure 30. The first bumps 250 are electrically connected to the second redistribution layer 340.

Figure 4D:
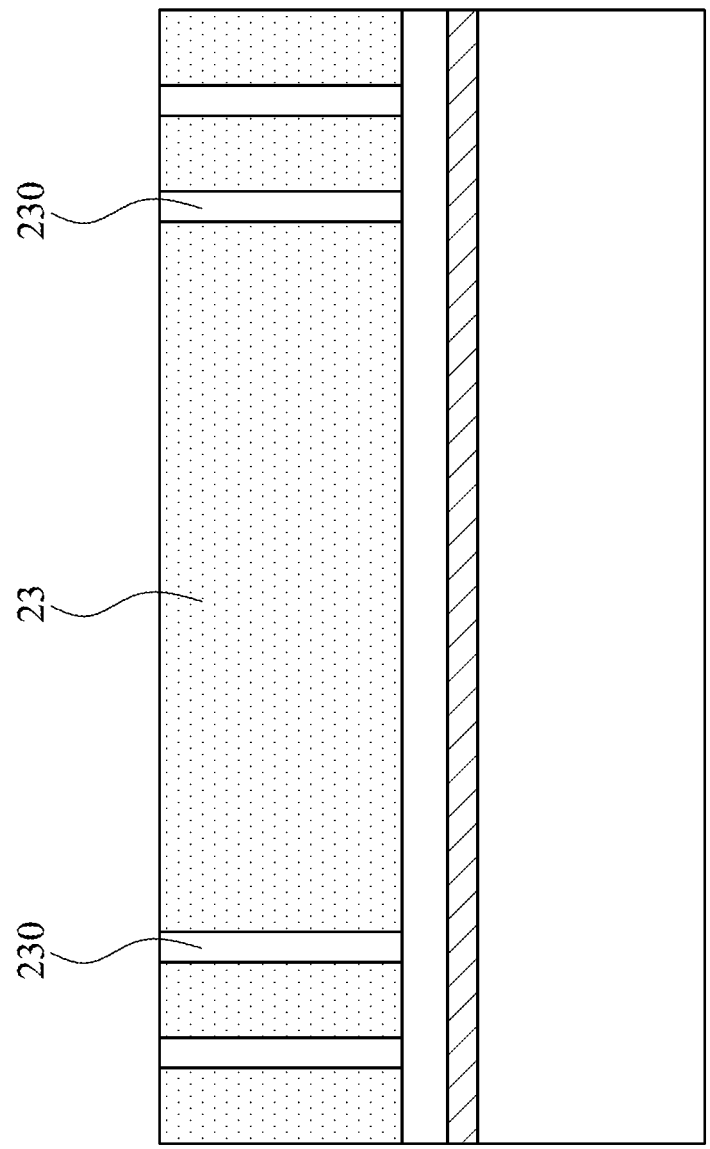

FIGS. 4A to 4J are schematic cross-sectional views of various stages of a method of manufacturing a first package structure in according to an embodiment of the present disclosure. As shown in FIG. 4A, a first carrier substrate 21 is provided. In some embodiments, the first carrier substrate 21 may be glass or other suitable materials. Subsequently, a first release film 22 is formed on the first carrier substrate 21. The first release film 22 may be a fluorine-base film, a silicon-coated polyethylene terephthalate film, a polymethylpentene film, a polypropylene film, or other suitable materials.

As shown in FIG. 4B, a first redistribution layer 240 is formed on the first release film 22, in which the bottom surface of the first redistribution layer 240 serves as a first surface of the first package structure 20. The formation of the first redistribution layer 240 may include forming a dielectric layer on the first release film 22. Then, a plurality of holes are formed (e.g. etching) in the dielectric layer. Then, a plurality of conductive vias are formed in the holes, and a plurality of conductive features (e.g. metal lines) may be formed to connect parts of the holes for interconnection. In some embodiments, the first redistribution layer 240 may be single layer structure or multi layers structure.

As shown in FIG. 4C, a temporary layer 23 is formed on the first redistribution layer 240. In some embodiments, the temporary layer 23 may be a photoresist layer. Then, the temporary layer 23 is patterned with a predetermined pattern to form a plurality of recesses 24 in the temporary layer 23.

As shown in FIG. 4D, the recesses 24 are filled with a conductive material to form a plurality of conductive features 230 in the temporary layer 23. In some embodiments, the conductive material may be metal, such as aluminum (Al), tungsten (W), copper (Cu), Cobalt (Co), or other suitable conductive materials. The formation of the conductive features 230 may be plating, deposition, or other suitable technologies. In some embodiments, after forming the conductive features 230, a planarization process is performed, such as chemical mechanical planarization, to remove the excessive conductive material. In some other embodiments, the conductive features 230 may be formed by directly attaching conductive pillars on the first redistribution layer 240. Accordingly, all of the first conductive features 230 are substantially formed at the same time.

Figure 4E:
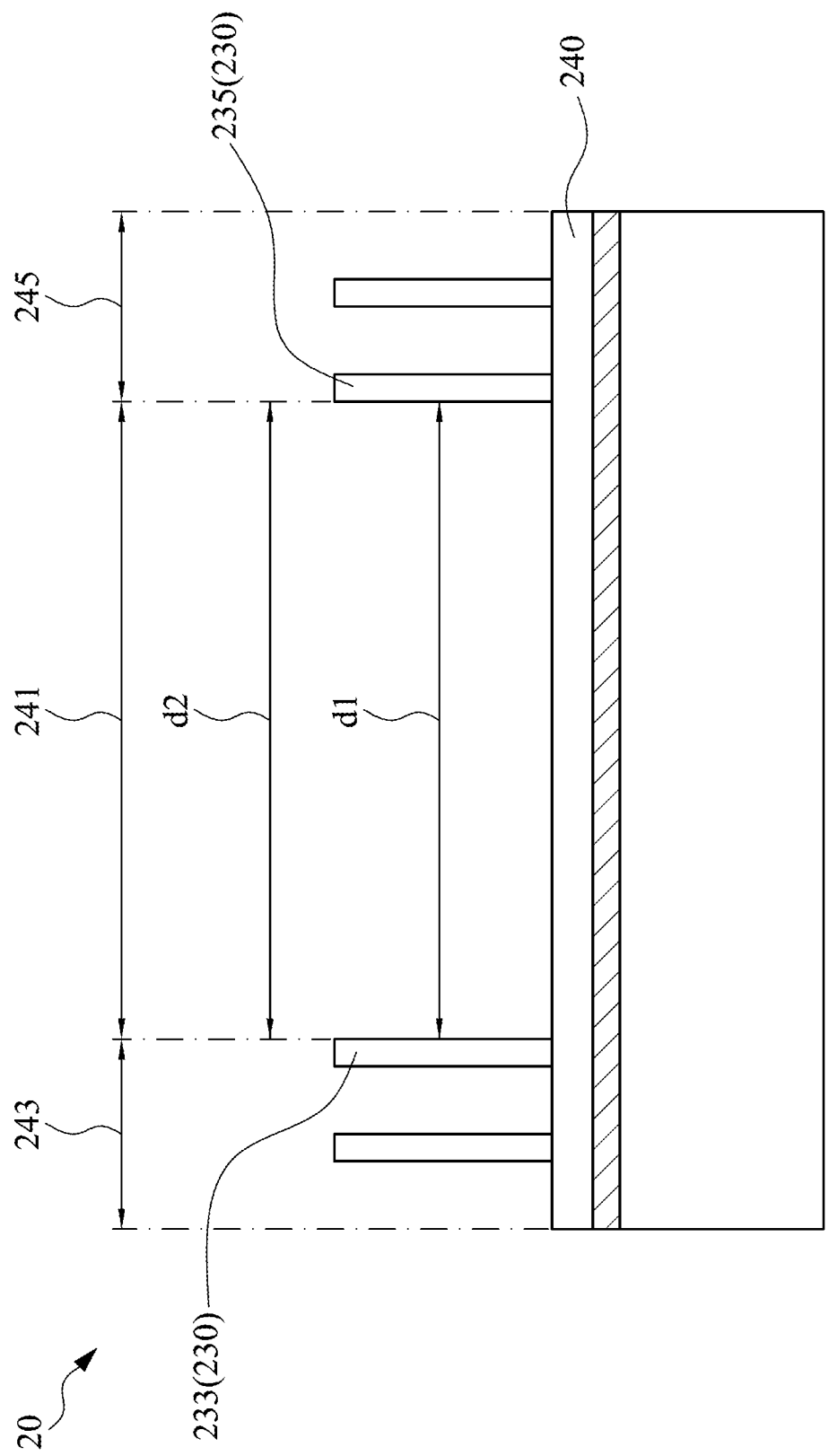

As shown in FIG. 4E, the temporary layer 23 is removed, and the conductive features 230 are formed on the first redistribution layer 240.

Additionally, the first package structure 20 may be horizontally separated into a central region 241, and peripheral region 243 and 245 adjacent to the central region 241. In other words, the peripheral region 243 and 245 encompass the central region 241. The central region 241 provides an available zone for die placement. Further, the first conductive features 230 include a first inner conductive feature 233 disposed in the peripheral region 243, and is attached to the interface between the peripheral region 243 and the central region 241. On the other hand, the first conductive features 230 include a second inner conductive feature 235 disposed in the peripheral region 245, and is attached to the interface between the peripheral region 245 and the central region 241. On the other words, the range of the central region 241 is defined by the first inner conductive feature 233 and the second inner conductive feature 235.

Thus, the distance $d1$ between the first inner conductive feature 233 and the second inner conductive feature 235 is substantially equal to the distance $d2$ of the central region 241. From a different perspective, the size of the distance $d2$ of the central region 241 depends on the distance $d1$ between the first inner conductive feature 233 and the second inner conductive feature 235, which are collectively called the most inner conductive features pair. Accordingly, the larger the distance $d1$ is, the larger distance $d2$ will be. That is, the size of the available zone for placing chips is defined by the most inner conductive features pair. In actual practice, the pattern of the most inner conductive features pair maybe previously designed according to the design requirement.

The conductive features 230 in the peripheral region 243 may be omitted in some embodiments, and the conductive features 230 in the peripheral region 245 may be omitted in some other embodiments. Due to the omission of the conductive features 230 in one of the peripheral regions (243 or 245), the central region 241 may extend to one side of the first package structure where the conductive features 230 are omitted. Thus, the size of the available zone for placing chips is defined by a most inner conductive feature and one side of the central region 241 opposite to the most inner conductive feature.

Figure 4F:
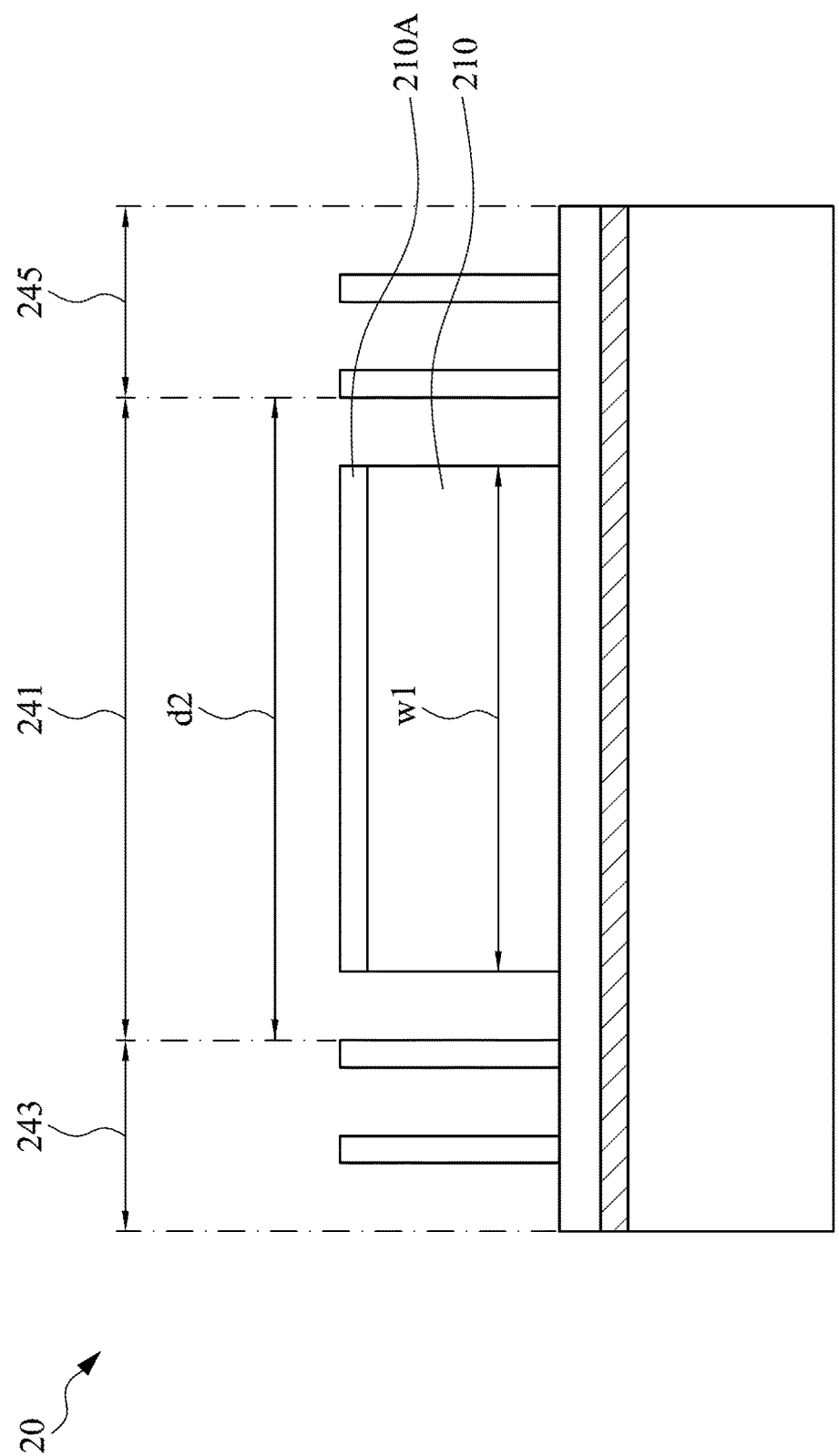

As shown in FIG. 4F, a first die 210 is attached on the first redistribution layer 240. A first active region 210A of the first die 210 is present on the top of the first die 210. That is, the first active region 210A is disposed on the side of the first die 210 away from the first redistribution layer 240. The first die 210 has a width W1, in which the width $d1$ may be smaller or equal to the distance $d2$ of the central region 241, which provides an available zone for the first die 210.

In some embodiments, the number of the dies may be two or more according to the design requirement. Accordingly, the total width of the dies may be smaller or equal to the distance $d2$ of the central region 241, which provides an available zone for the first die 210.

In some embodiments, an interposed layer may be formed between the first redistribution layer 240 and the first die 210, such as the interposed layer 212B and 214B in FIG. 2. The material of the interposed layer may be dissipating material, such as a heat sink.

Figure 4G:
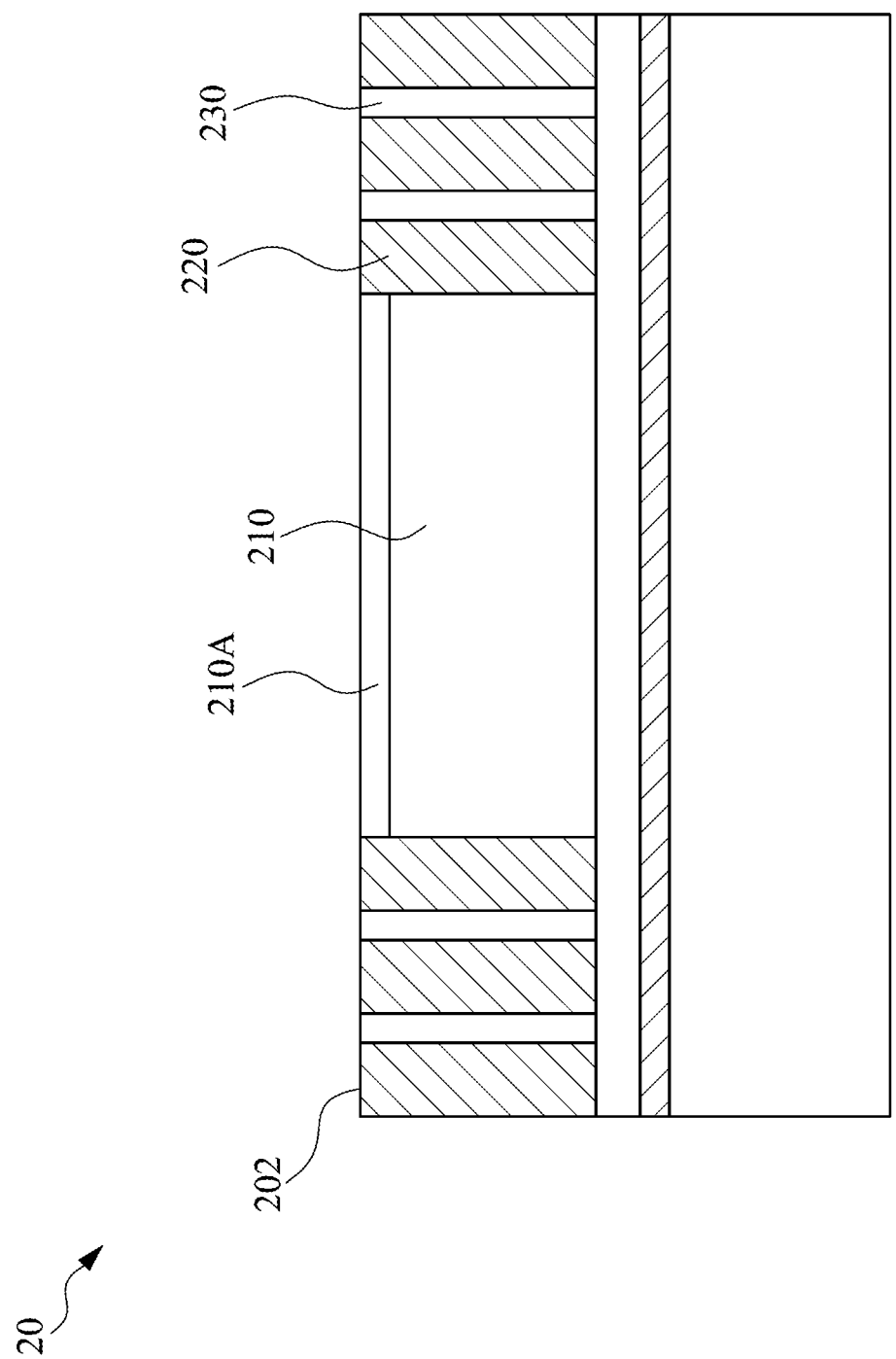

As shown in FIG. 4G, a first molding material 220 is filled into the spaces between the first conductive features 230 and the spaces between the first conductive features 230 and the first die 210 by a molding tool. In some embodiments, the molding tool includes a protective layer such that the first molding material 220 will not overflow to the top of the first active region 210A. In some embodiments, the top surface of the first active region 210A of the first die 210, the top surface of the first conductive features 230, and the top surface of the first molding material 220 are substantially coplanar and serve as a second surface 202 of the first package structure 20.

Figure 4H:
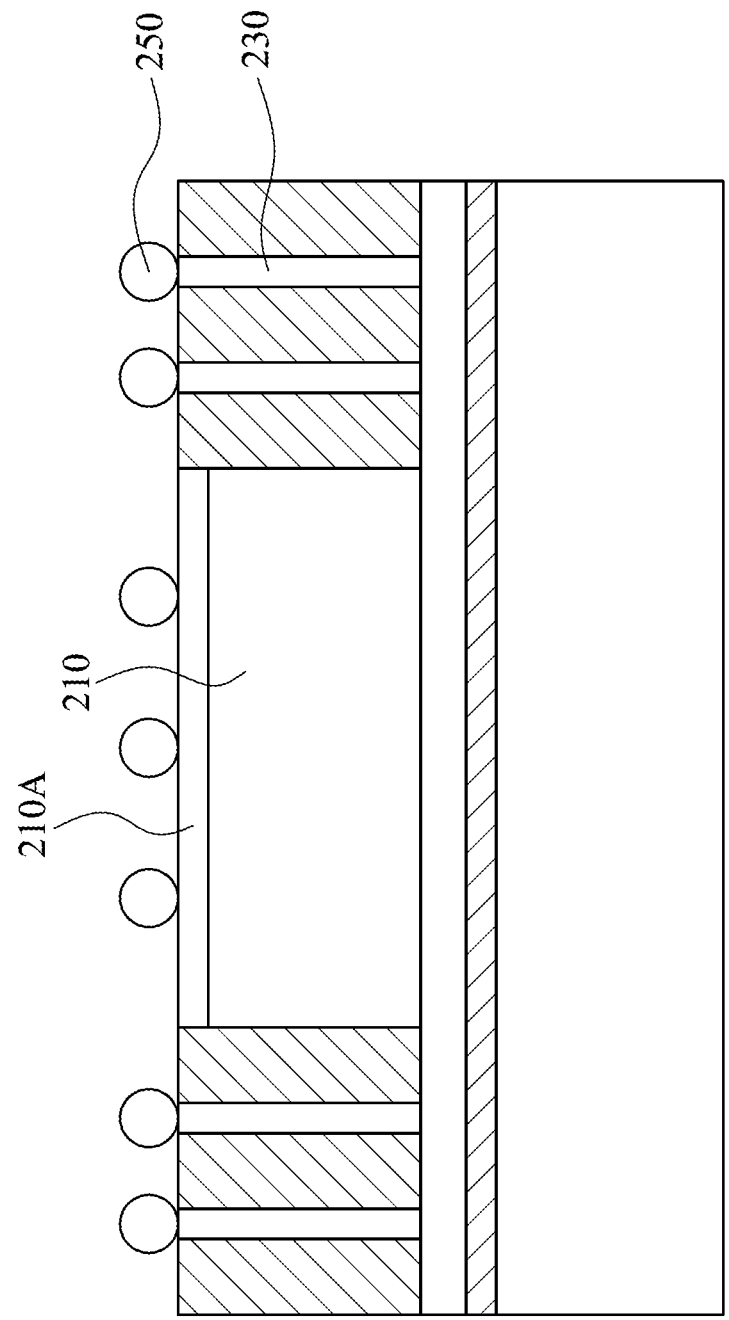

As shown in FIG. 4H, a plurality of first bumps 250 are formed on the second surface 202 of the first package structure 20. In some embodiments, the first bumps 250 may be solder bumps, and may be metal, such as tin, silver, or alloy. The first bumps 250 are electrically connected to the first active region 210A of the first die 210 and the first conductive features 230. Also, the first bumps 250 are directly contact with the first active region 210A and the first conductive features 230.

In some embodiments, before forming the first bumps 250, another redistribution layer may be formed on the first active region 210A of the first die 210, the first molding material 220, and the first conductive features 230 according to the design requirement, such as the third redistribution layer 342 in FIG. 2.

Figure 4I:
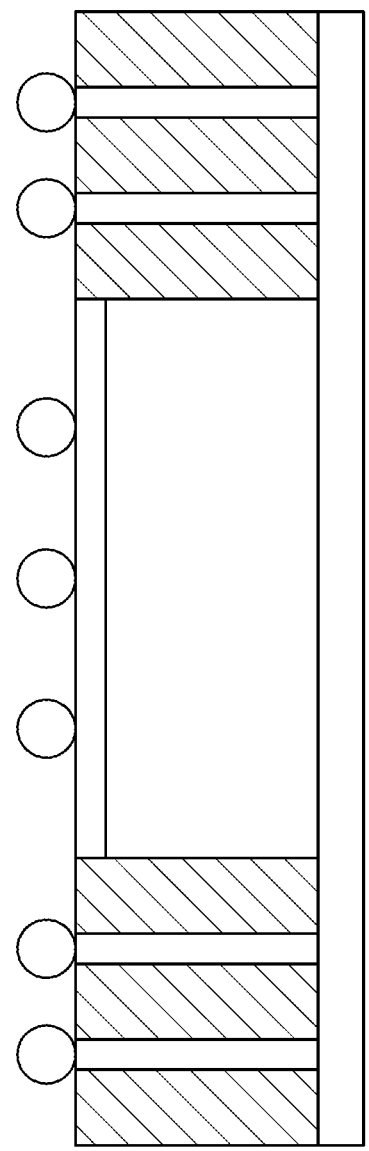

As shown in FIG. 4I, the first carrier substrate 21 and the first release film 22 are removed, and the first package structure 20 is completely formed.

Figure 4J:
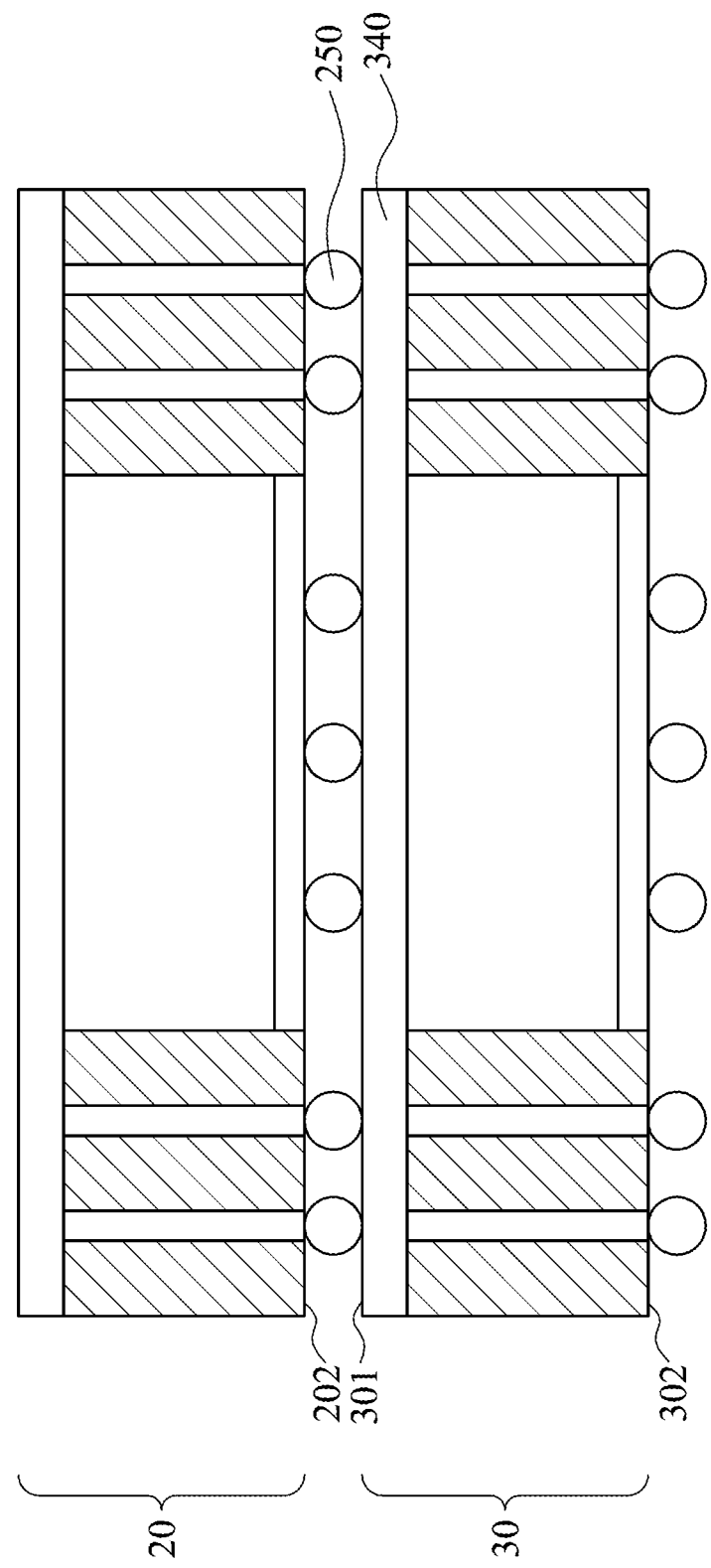

As shown in FIG. 4J, the first package structure 20 is flipped and stacked on a second package structure 30. The configuration of the second package structure 30 may be similar to that of the first package structure 20, as described in FIG. 1, but the disclosure is not limited thereto. In this embodiment, the second surface 202 of the first package structure 20 faces to the third surface 301 of the second package structure 30. The first bumps 250 are electrically connected to the second redistribution layer 340.

FIGS. 5A to 5D are schematic cross-sectional views of various stages of a method of manufacturing a stacked package structure 14 described in FIG. 3. Some description similar to the method of FIGS. 4A to 4J may be omitted for simplicity.

Figure 5A:
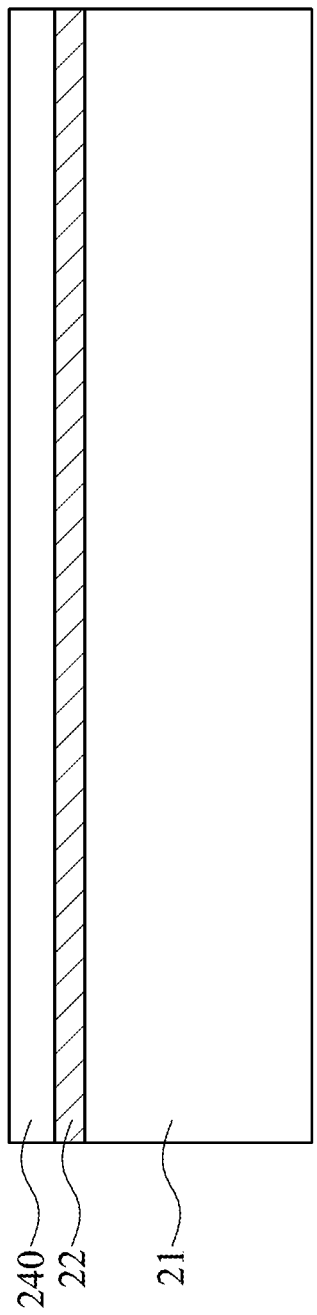
FIGS. 5A to 5D are schematic cross-sectional views of various stages of a method of manufacturing a stacked package structure according to an embodiment of the present disclosure.

As shown in FIG. 5A, a first redistribution layer 240 is formed on a first release film 22 disposed on a first carrier substrate 21, in which the bottom surface of the first redistribution layer 240 serves as a first surface of the first package structure 20.

Figure 5B:
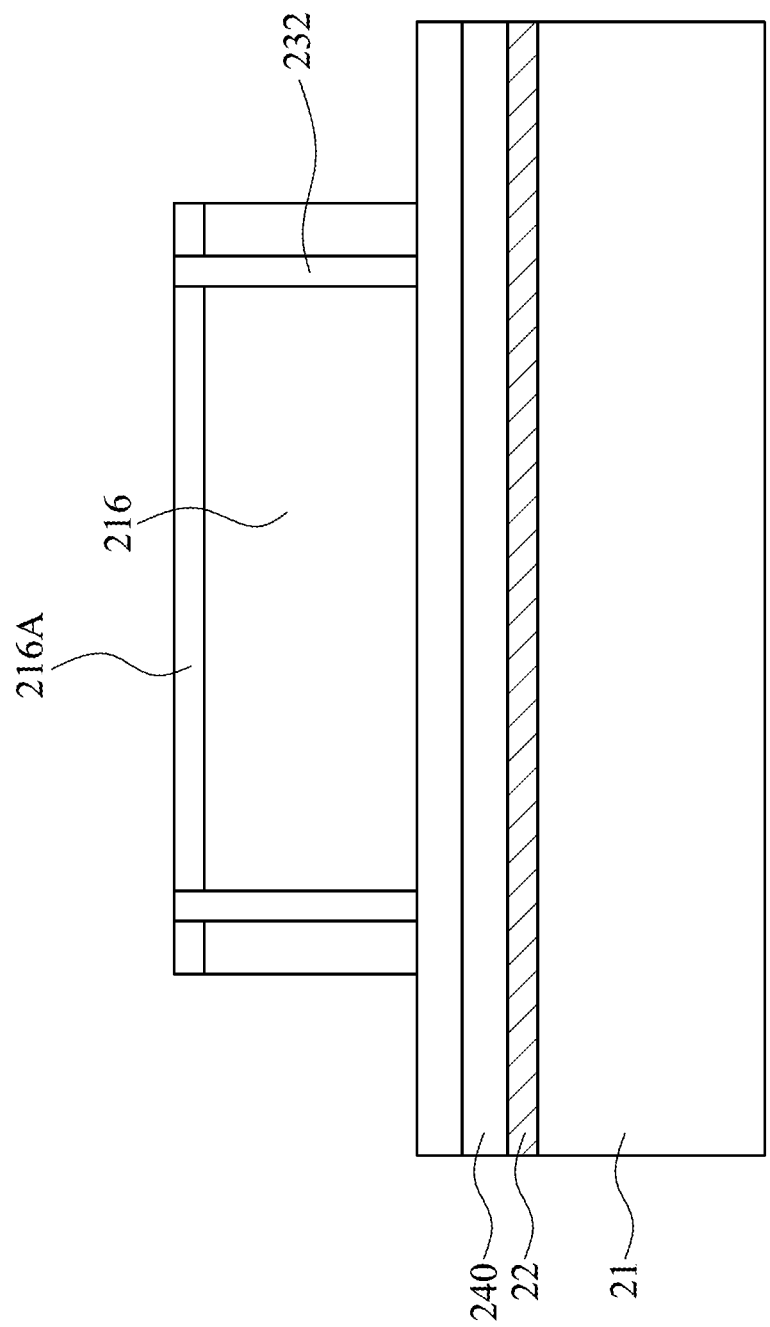

As shown in FIG. 5B, a sixth die 216 is attached on the first redistribution layer 240. A first active region 210A of the first die 210 is present on the top of the first die 210. That is, the first active region 210A is disposed on the side of the first die 210 away from the first redistribution layer 240. Moreover, the number of the dies may be two or more according to the design requirement.

In this embodiment, before attaching the sixth die 216 on the first redistribution layer 240, a plurality of first conductive features 232 are formed in the sixth die 216. In some embodiment, the formation of the first conductive features 232 may be recessing the sixth die 216 and forming plural openings in the sixth die 216. Subsequently, filling the openings with conductive material, such as aluminum (Al), tungsten (W), copper (Cu), Cobalt (Co), or other suitable conductive materials, to form the first conductive features 232. The above methods are not intended to limit the disclosure, other suitable method for forming conductive features in a die may also be applied.

Figure 5C:
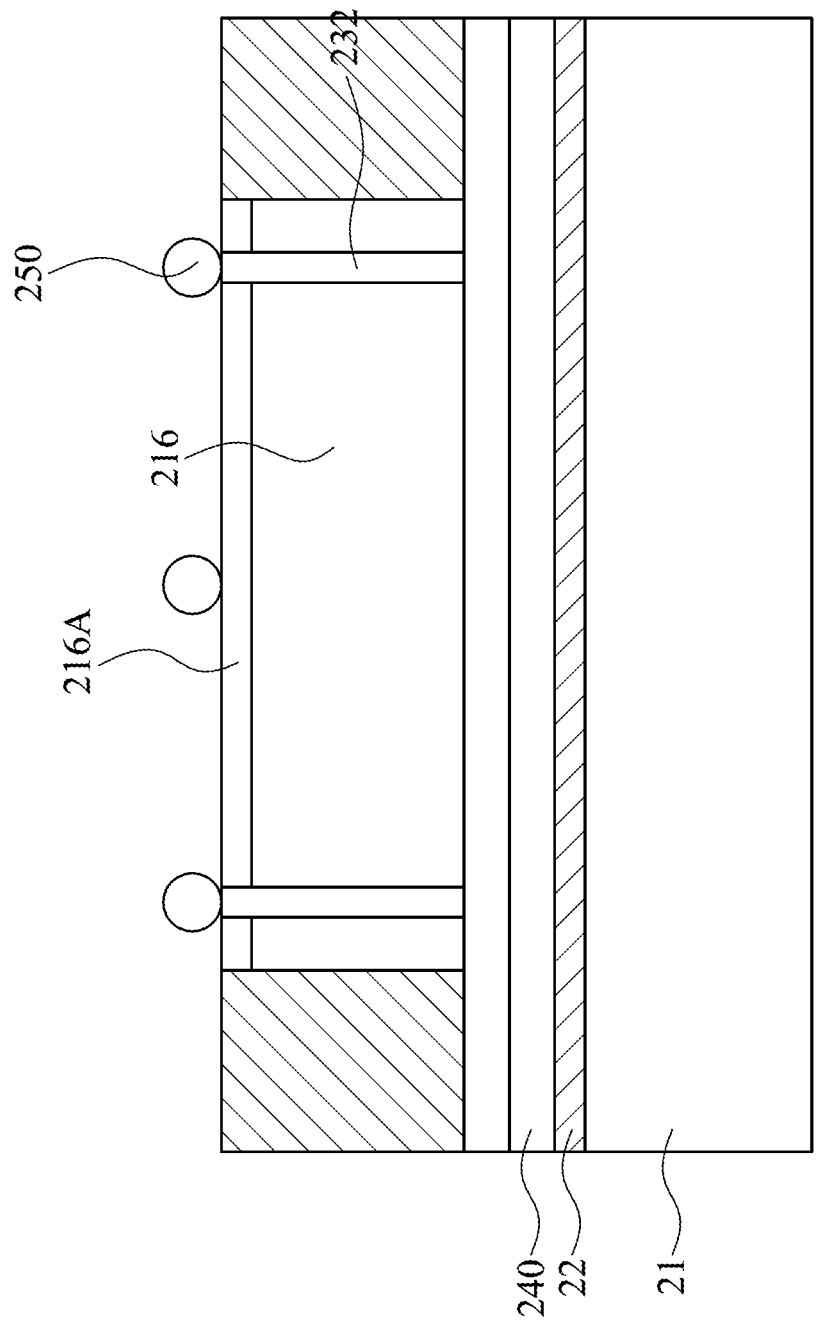

As shown in FIG. 5C, a first molding material 220 is formed by a molding tool, in which the first molding material 220 surrounds the sixth die 216. In some embodiments, the molding tool includes a protective layer such that the first molding material 220 will not overflow to the top of the six active region 216A. In some embodiments, the top surface of the six active region 216A, the top surface of the first conductive features 232, and the top surface of the first molding material 220 are substantially coplanar and serve as a second surface 202 of the first package structure 20. In some other embodiments, the first molding material 220 may be omitted.

On the other hand, a plurality of first bumps 250 are formed on the second surface 202 of the first package structure 20. The first bumps 250 are electrically connected to the six active region 216A and the first conductive features 232. Also, the first bumps 250 are directly contact with the six active region 216A and the first conductive features 232.

Figure 5D:
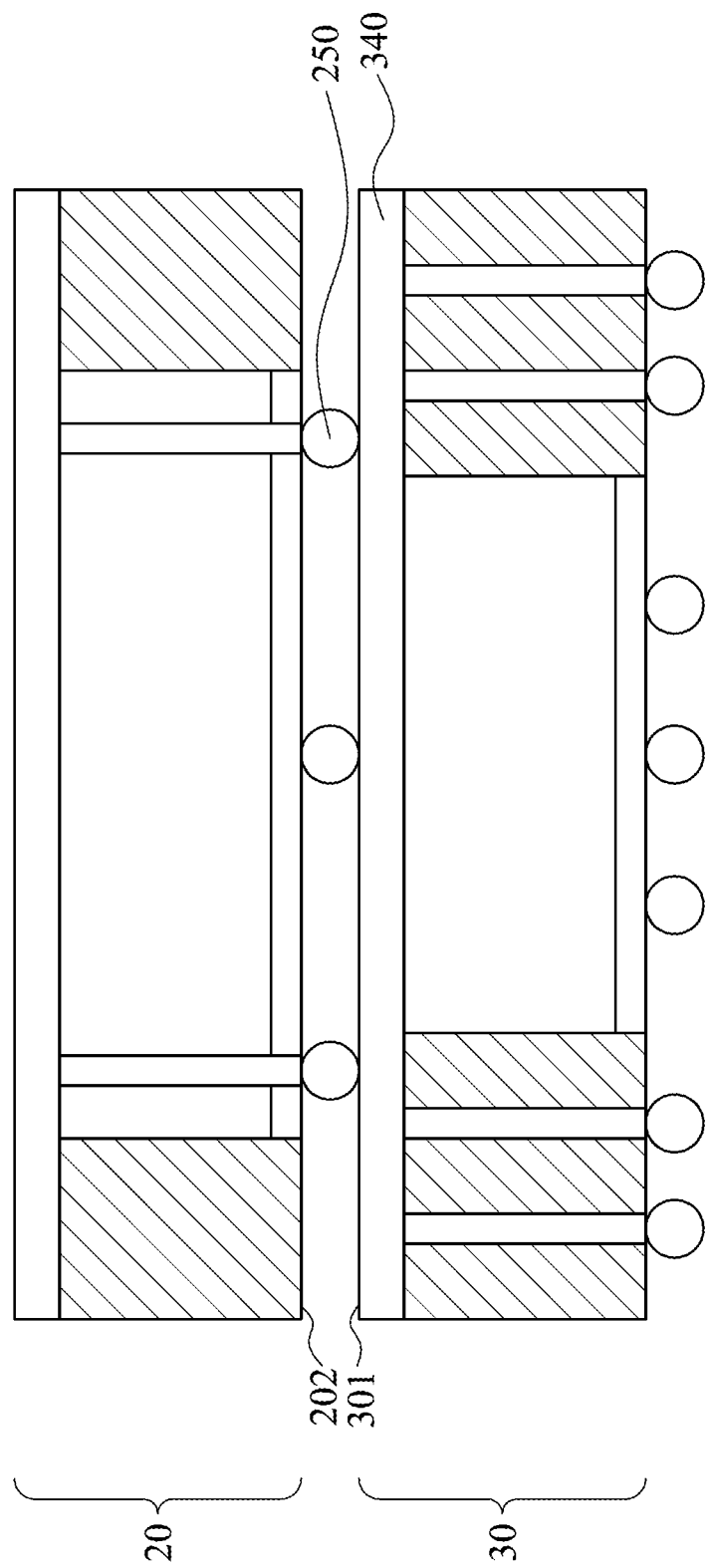

As shown in FIG. 5D, the first package structure 20 is flipped and stacked on a second package structure 30. The configuration of the second package structure 30 may be similar to that described in FIG. 1, but the disclosure is not limited thereto. In this embodiment, the second surface 202 of the first package structure 20 faces to the third surface 301 of the second package structure 30. The first bumps 250 are electrically connected to the second redistribution layer 340.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for manufacturing a stacked package structure, comprising:
    forming a first package structure having a first surface and a second surface, comprising:
    forming a first release film on a first carrier substrate;
    forming a first redistribution layer on the first release film, wherein a bottom surface of the first redistribution layer serves as the first surface;
    attaching at least one first die on the first redistribution layer, wherein the first die has a first active region disposed on a side away from the first redistribution layer of the first die;
    forming a plurality of first conductive features on the first redistribution layer;
    forming a plurality of first bumps on the first die, wherein a part of the first bumps are electrically connected to the first active region, and the first bumps are in direct contact with the first conductive features and the first active region; and
    removing the first carrier substrate and the first release film.

2. The method of claim 1,
    wherein the first conductive features connect the first redistribution layer to another part of the first bumps.

3. The method of claim 1, wherein forming the first conductive features comprises:
    defining a central region, and at least one peripheral region adjacent to the central region in the first package structure, wherein the first die is disposed at the central region.

4. The method of claim 3, wherein the central region is defining by a most inner conductive feature pair disposed in the at least one peripheral region.

5. The method of claim 3, wherein a width of the at least one first die is smaller or equal to a distance of the central region.

6. The method of claim 1, further comprising:
    forming a second package structure having a third surface and a fourth surface, comprising:
    forming a second release film on a second carrier substrate;

forming a second redistribution layer on the second release film, wherein a bottom surface of the second redistribution layer serves as the third surface;

attaching at least one second die on the second redistribution layer, wherein the second die has a second active region disposed on a side away from the second redistribution layer of the second die;

forming a plurality of second bumps on the second active region, wherein a part of the second bumps are electrically connected to the second active region; and removing the second carrier substrate and the second release film;

flipping the first package structure and the second package structure; and stacking the first package structure on the second package structure, wherein the second surface faces the third surface, and the first bumps are electrically connected to the second redistribution layer.

7. The method of claim 6, wherein stacking the first package structure on the second package structure further comprising:

directly connecting the first bumps to the second redistribution layer.

* * * * *